United States Patent

[11] 3,576,969

[72] Inventors Rohinton J. Surty
Redwood City, Calif.;
Conrad Trollmann, Baden Wurttemberg, Germany
[21] Appl. No. 854,396
[22] Filed Sept. 2, 1969
[45] Patented May 4, 1971
[73] Assignee International Business Machines Corporation
Armonk, N.Y.

[54] SOLDER REFLOW DEVICE
1 Claim, 1 Drawing Fig.

[52] U.S. Cl. ........ 219/221, 219/85, 219/227, 219/237, 219/543, 228/51, 338/308
[51] Int. Cl. ........ B23k 3/02, H05b 3/10
[50] Field of Search ........ 219/221, 226–241, 543; 219/85, 228–231; 338/306–309; 228/20; 228/51–55

[56] References Cited

UNITED STATES PATENTS

| | | | |
|---|---|---|---|
| 2,474,312 | 6/1949 | Halpern | 219/229(UX) |
| 2,606,987 | 8/1952 | Winstead | 219/543 |
| 3,105,136 | 9/1963 | Ashenfarb | 219/543X |
| 3,136,878 | 6/1964 | Staller | 219/239 |
| 3,146,692 | 9/1964 | Connolly et al. | 219/243X |
| 3,230,338 | 1/1966 | Kawecki | 219/238X |
| 3,382,564 | 5/1968 | Gallentine | 228/20 |
| 3,478,191 | 11/1969 | Johnson et al. | 219/543X |

OTHER REFERENCES

" Self-Leveling Soldering Tool," N. F. Jensen, IBM Technical Disclosure Bulletin, Vol. 11, No. 8, Jan. 1969, copy in 219/85

*Primary Examiner*—A. Bartis
*Attorneys*—Hanifin & Jancin and Wm. J. Kopacz

ABSTRACT: Disclosed is a device for simultaneously soldering numerous integrated circuit chip leads to a circuit board. The device is characterized by having a heating tip made of refractory, electrically insulative, thermally conductive, material. Fused to this tip is a coat of penetrating metallic paste. The paste is disposed on the tip in an electrically continuous path. Heating is accomplished by passing current through this metallic paste path.

PATENTED MAY 4 1971 3,576,969
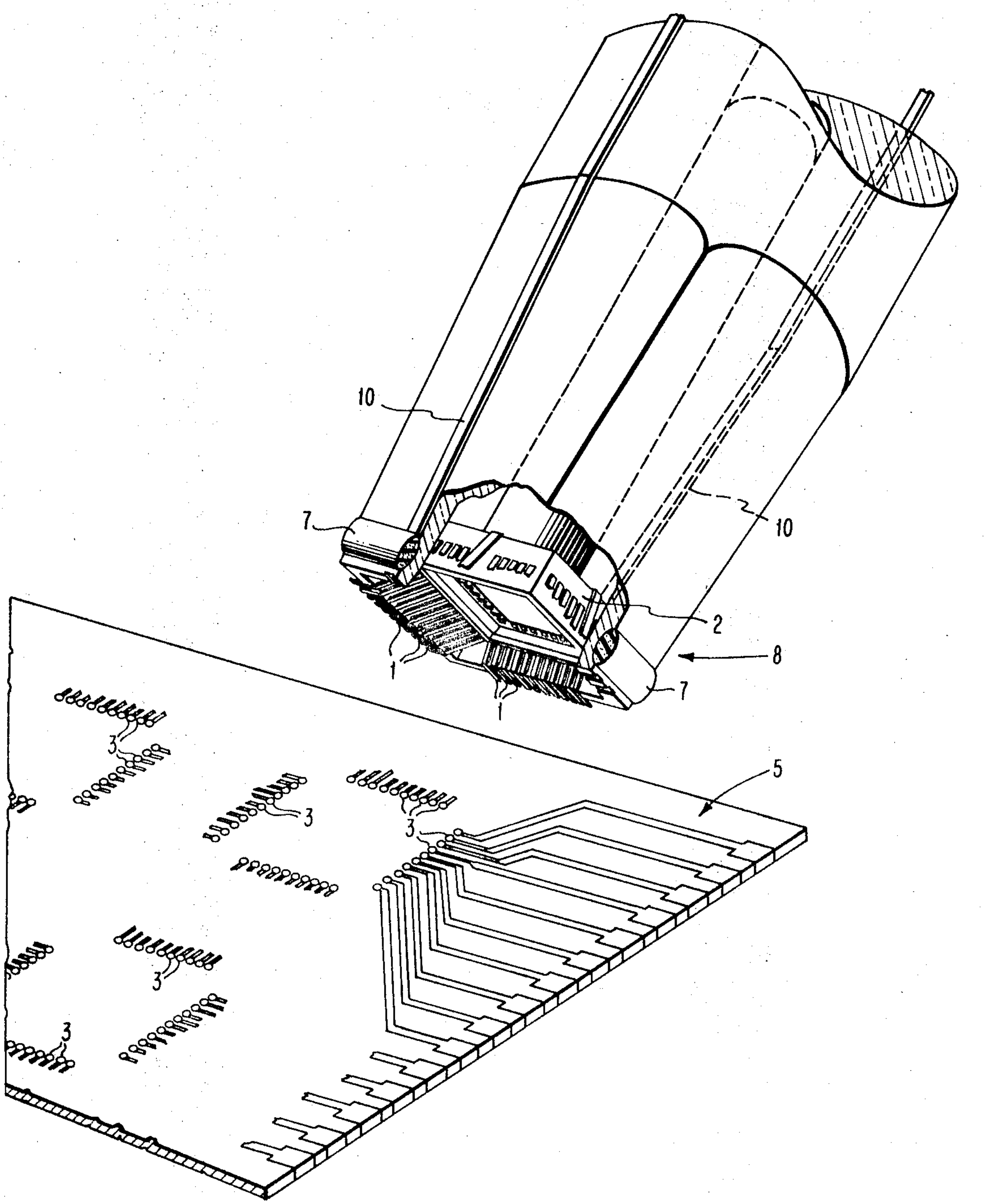
*INVENTORS*
ROHINTON J. SURTY
CONRAD TROLLMANN
*BY*
ATTORNEY

SOLDER REFLOW DEVICE

BACKGROUND OF THE INVENTION

The soldering of integrated circuit chip leads to a circuit board poses unique bonding problems. Since the time required to transmit information from one chip location to another is related to distance between the two locations, it is highly desirable to keep this distance at a minimum. The chips must therefore be placed as close as possible to one another. The soldering of chips in a high density array is troublesome because stray heat generated by any particular soldering operation can heat the solder on the already bonded adjacent chips. The connections on the already bonded adjacent chips will therefore be weakened, or even broken. The integrated circuit chips used in modern computers have 44 leads, or more, per chip. If simultaneous bonding of all 44 leads is attempted, the stray heat problem becomes magnified.

Further, integrated circuits are electrically sensitive and can be easily damaged by improper voltages. Contact of the chip leads with a soldering tool's current-carrying element would be disastrous. Contact of the chip leads with any electrical conductors is dangerous. If the conductor is carrying an accidentally produced voltage, the chip can be destroyed.

Conventional electrical insulation of a soldering tool's current-carrying element from its heat applying element is inefficient. If the heat applying element is made of metal and the current-carrying element is merely insulated wire, a great deal of unusable heat must be generated in order to sufficiently heat the metallic heat applying element. This is because the insulation on conventional insulated wire is a poor conductor of heat. The electrical insulation, therefore, creates thermal insulation.

Further, air pockets exist between the insulated wire and the heat applying element. Perfect airtight physical contact between the surface of the insulated wire and the surface of the heat applying element, for practical purposes, is impossible to achieve. These air pockets create still another strong thermal barrier between the current-carrying element and the heat applying element. The heat produced by the current-carrying element must traverse the electrical insulation and pockets of air before reaching the heat applying element.

If the current-carrying element is wrapped around the surface of the heat applying element, a great deal of unusable heat is generated. Heat flows from the surface of the insulated wire in all directions. If one considers the entire circumferential surface of a wire which is wrapped about an object, it will be realized that only a small portion of that circumferential surface actually touches the object. Since heat flows from the entire circumferential surface, a full 50 percent of the heat actually flows away from, or parallel to, the surface of the object to be heated. This is wasted heat. Further, most of the remaining 50 percent of the heat must traverse a considerable airgap before it reaches the surface.

The proper bonding of an integrated circuit chip to a circuit board has two requisites. First, the solder coated leads of the chip must be placed on the appropriate circuit board lands and held in firm contact with these lands. Secondly, the solder coated leads must be heated so as to reflow the solder. The leads can be quite small (0.006 inches wide) and closely adjacent to one another (0.005 inches apart). If the leads are not held firmly in place while being heated, heat expansion will cause them to move, producing defective bonds.

There existed a need for a bonding device which was thermally and electrically efficient, which was capable of soldering simultaneously all the leads of an integrated chip to a circuit board, which was capable of holding the leads in proper alignment, which would produce a minimum of stray heat, and which would isolate the chip leads from electrical conductors.

It is therefore an object of the present invention to provide a soldering device electrically insulated from the leads to be soldered.

It is a further object of the present invention to provide a bonding device capable of soldering a large number of leads simultaneously.

A further object of the present invention is to provide a bonding device which produces a minimum of stray or unusable heat.

A further object of the present invention is to provide a bonding device which is thermally and electrically efficient.

A further object of the present invention is to provide a soldering device which is mechanically strong.

A further object of the present invention is to provide a device which will insure that the leads to be soldered will be in proper alignment.

Other objects will appear hereinafter.

SUMMARY OF THE INVENTION

The disclosed device accomplishes these and other objects by utilizing a heat applying tip made of refractory, thermally conductive, electrically insulative material such as ceramic, beryllium oxide, or glass. This tip carries slots into which the chip leads are inserted. The slots assure proper alignment and firm contact of the leads with the circuit board lands during heating. The heat production element is a path of penetrating metallic paste, such as molybdenum manganese or deep penetrating tungsten, applied to the refractory material. Current is passed through the paste, heating the heat applying tip. The paste, instead of merely being on the surface of the heat applying tip, actually penetrates and fuses with the refractory material of which the tip is constructed. No thermal barriers exist between the heat producing metallic paste and the heat applying tip member. This insures maximum efficiency and minimum unusable heat.

BRIEF DESCRIPTION OF THE DRAWING

The FIGURE shows an isometric view of the soldering tool together with chip and circuit board.

DESCRIPTION OF THE PREFERRED EMBODIMENT

The FIGURE shows a device for soldering a chip 2 to a circuit board 5. Chip 2 has leads 1 which are to be soldered to the appropriate lands 3. There are actually 11 leads on each of the four sides of the chip. Leads 1 and lands 3 are coated with solder. Chip 2 is held in the device mechanically or by vacuum. Heat applying element 8 is penetrated by heat producing element 7.

Heat applying element 8 is made of a refractory material which is thermally conductive and electrically insulative. Examples are ceramic, glass and beryllium oxide. Heat producing element 7 is a metallic paste such as molybdenum manganese or deep penetrating tungsten. The combination of molybdenum manganese and ceramic has been found to be particularly effective. The fusing of the molybdenum manganese with ceramic is a well-known process. Ceramic circuit boards having molybdenum manganese metallurgy fused thereto are currently commercially available.

A power source is connected to the penetrating paste film 7 by connectors 10. Current passes through the paste 7 producing heat which is conducted by the thermally conductive, electrically insulative heating tip 8 to the solder coated leads 1. The metallic paste 7 can be applied to the heating tip 8 with great resolution. This insures that the heat will be applied only to those areas where it will be needed. Since the current carrying paste 7 is actually embedded and fused to the thermally conductive heating tip 8, no air or other heat barrier exists between the heat producing metallic paste member 7 and the heating tip 8. Unusable or stray heat is therefore kept to a minimum.

Heating tip 8 carries slots 11 into which leads 1 fit. These slots assure that leads 1 will be in proper alignment with the circuit board lands, and will not move during heating.

In operation chip 2 is placed into the recess with circuit leads 1 placed in the slots 11. The heating tip 8 is lowered onto the circuit board 5 so that the leads will make contact with their appropriate lands 3. Power is then supplied to the metallic paste 7 through conductor 10 producing heat which is conducted through the heating tip 8 to the solder coated leads 1.

The solder melts and the leads 1 become bonded to the lands 3. The chip is released and the tool lifted.

The entire operation can be performed automatically by use of a computer control. The computer can be programmed to direct an *x-y-z* positioner to which the bonding tool is attached.

The life of the metallic paste can be extended by plating the outer surface of the paste or by coating it with glass.

Penetrating metallic paste can also be used in sealing ceramic flat packs. Current is brought from the exposed top surface of the lid to the enclosed bottom surface by means of metallic paste. The enclosed bottom surface carries a coat of solder. Current passes from the paste to the solder causing the solder to melt and, thereby, bonding the lid to the pack.

While the invention has been particularly shown and described with reference to preferred embodiments thereof, it will be understood by those skilled in the art that various changes in the form and details may be made therein without departing from the spirit and scope of the invention.

We claim:

1. A solder reflow device for bonding an element having connector leads to a member comprising:
   - a heating tip having a recess therein for receiving said element;
   - said heating tip having slots for receiving said leads;
   - said heating tip being made of refractory, thermally conductive electrically insulative material;
   - metallic paste means fused to and diffused into a portion of a surface of said heating tip in an electrically continuous path;
   - means for conducting electrical energy to said paste means whereby said paste heats said tip and said tip heats said leads.